United States Patent
Sun et al.

(10) Patent No.: US 8,278,925 B2
(45) Date of Patent: Oct. 2, 2012

(54) METHOD FOR RELAXATION-COMPENSATED FAST MULTI-SLICE CHEMICAL EXCHANGE SATURATION TRANSFER MRI

(75) Inventors: Phillip Zhe Sun, Cambridge, MA (US); Gregory Sorensen, Belmont, MA (US)

(73) Assignee: The General Hospital Corporation, Boston, MA (US)

( * ) Notice: Subject to any disclaimer, the term of this patent is extended or adjusted under 35 U.S.C. 154(b) by 496 days.

(21) Appl. No.: 12/412,132

(22) Filed: Mar. 26, 2009

(65) Prior Publication Data

US 2010/0026297 A1   Feb. 4, 2010

Related U.S. Application Data

(60) Provisional application No. 61/039,478, filed on Mar. 26, 2008.

(51) Int. Cl.
*G01V 3/00* (2006.01)

(52) U.S. Cl. .......................... 324/308; 324/307; 324/309

(58) Field of Classification Search .......... 324/300–322; 600/410, 416, 420, 411, 419; 436/173; 424/9.3, 424/9.37, 1.69; 435/6; 536/23.1; 548/409; 382/128–132; 514/2
See application file for complete search history.

(56) References Cited

U.S. PATENT DOCUMENTS

| | | | | |
|---|---|---|---|---|
| 5,050,609 A * | 9/1991 | Balaban et al. | ............... | 600/410 |
| 6,943,033 B2 * | 9/2005 | Van Zijl et al. | ............... | 436/173 |
| 6,980,845 B1 * | 12/2005 | Alsop | ........................... | 600/410 |
| 7,369,888 B2 * | 5/2008 | Alsop | ........................... | 600/419 |
| 7,610,077 B2 * | 10/2009 | Dixon et al. | ................... | 600/420 |
| 7,683,617 B2 * | 3/2010 | Van Zijl et al. | ............... | 324/309 |
| 7,865,228 B2 * | 1/2011 | Alsop | ........................... | 600/419 |
| 8,148,982 B2 * | 4/2012 | Witschey et al. | ............. | 324/309 |
| 2003/0160610 A1 * | 8/2003 | Van Zijl et al. | ............... | 324/300 |
| 2004/0030239 A1 * | 2/2004 | Van Zijl et al. | ............... | 600/420 |
| 2005/0277828 A1 * | 12/2005 | Alsop | ........................... | 600/419 |
| 2007/0134159 A1 * | 6/2007 | Dixon et al. | ................... | 424/9.3 |
| 2007/0196280 A1 * | 8/2007 | Shen | ............................ | 424/9.3 |
| 2008/0197840 A1 * | 8/2008 | Van Zijl et al. | ............... | 324/307 |
| 2008/0208033 A1 * | 8/2008 | Alsop | ........................... | 600/411 |
| 2008/0284427 A1 * | 11/2008 | van Zijl et al. | ............... | 324/307 |
| 2009/0088578 A1 * | 4/2009 | Lascola et al. | ................ | 548/490 |
| 2009/0196830 A1 * | 8/2009 | Lamerichs et al. | .......... | 424/9.37 |
| 2010/0026297 A1 * | 2/2010 | Sun et al. | ....................... | 324/309 |
| 2010/0129290 A1 * | 5/2010 | Yezdimer et al. | ............. | 424/1.69 |
| 2010/0227794 A1 * | 9/2010 | Yezdimer et al. | ................ | 514/2 |
| 2010/0264920 A1 * | 10/2010 | Witschey et al. | ............. | 324/309 |
| 2010/0286502 A1 * | 11/2010 | Van Zijl et al. | ............... | 600/410 |

OTHER PUBLICATIONS

J. Zhou et al, Amide Proton Transfer Contrast for Imaging of Brain Tumors; Proc. Intl. Soc. Mag. Reson. Med. 11 (2003); p. 42.

J. Zhou et al; Detecting Brain Tumor Therapy Responses Using Amide Proton Transfer Contrast; Proc. Intl. Soc. Mag. Reson. Med. 13 (2005); p. 243.

* cited by examiner

*Primary Examiner* — Melissa Koval
*Assistant Examiner* — Tiffany Fetzner
(74) *Attorney, Agent, or Firm* — Quarles & Brady LLP

(57) ABSTRACT

A volumetric APT imaging sequence is provided that acquires multi-slice images immediately after a single long continuous wave (CW) RF irradiation, wherein the relaxation-induced loss of CEST contrast is compensated for during post-processing. Thus, a fast volumetric pH-weighted APT imaging technique is provided.

20 Claims, 5 Drawing Sheets

METHOD FOR RELAXATION-COMPENSATED FAST MULTI-SLICE CHEMICAL EXCHANGE SATURATION TRANSFER MRI

CROSS-REFERENCE TO RELATED APPLICATIONS

This application is based on, incorporates herein by reference, and claims the benefit of U.S. Provisional Application Ser. No. 61/039,478, filed on Mar. 26, 2008, and entitled "METHOD FOR RELAXATION-COMPENSATED FAST MULTI-SLICE CHEMICAL EXCHANGE SATURATION TRANSFER MRI."

STATEMENT REGARDING FEDERALLY SPONSORED RESEARCH

This invention was made with United States government support awarded by the following agency: NIH/NINDS 5R01NSO38477-09. The United States has certain rights in this invention.

BACKGROUND OF THE INVENTION

The field of the invention is magnetic resonance imaging (MRI) and systems. More particularly, the invention relates to a method for chemical exchange saturation transfer MRI.

When a substance such as human tissue is subjected to a uniform magnetic field (polarizing field $B_0$), the individual magnetic moments of the excited nuclei in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically proven pulse sequences and they also enable the development of new pulse sequences.

The MR signals acquired with an MRI system are signal samples of the subject of the examination in Fourier space, or what is often referred to in the art as "k-space". Each MR measurement cycle, or pulse sequence, typically samples a portion of k-space along a sampling trajectory characteristic of that pulse sequence. Most pulse sequences sample k-space in a roster scan-like pattern sometimes referred to as a "spin-warp", a "Fourier", a "rectilinear", or a "Cartesian" scan. The spin-warp scan technique is discussed in an article entitled "Spin-Warp MR Imaging and Applications to Human Whole-Body Imaging" by W. A. Edelstein et al., Physics in Medicine and Biology, Vol. 25, pp. 751-756 (1980). It employs a variable amplitude phase encoding magnetic field gradient pulse prior to the acquisition of MR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of measurement cycles, or "views" that are acquired during the scan to produce a set of k-space MR data from which an entire image can be reconstructed.

An image is reconstructed from the acquired k-space data by transforming the k-space data set to an image space data set. There are many different methods for performing this task and the method used is often determined by the technique used to acquire the k-space data. With a Cartesian grid of k-space data that results from a 2D or 3D spin-warp acquisition, for example, the most common reconstruction method used is an inverse Fourier transformation ("2DFT" or "3DFT") along each of the 2 or 3 axes of the data set. With a radial k-space data set and its variations, the most common reconstruction method includes "regridding" the k-space samples to create a Cartesian grid of k-space samples and then perform a 2DFT or 3DFT on the regridded k-space data set. In the alternative, a radial k-space data set can also be transformed to Radon space by performing a 1DFT of each radial projection view and then transforming the Radon space data set to image space by performing a filtered backprojection.

Molecular imaging includes a variety of imaging modalities and employs techniques that detect molecular events such as cell signaling, gene expression, and pathologic biomarkers. These techniques seek to achieve early detection of diseases, better management of therapy treatment, and improved monitoring of cancer recurrence. MRI provides specific advantages for molecular imaging applications, due to its noninvasive nature. Traditional molecular MRI techniques rely on the administration of a contrast agent to a designated location within a subject. Oftentimes, a site-specific contrast agent is employed that interacts with a given molecule of interest. These conventional techniques, however, exhibit poor sensitivity, making the detection of the contrast agents difficult. This is especially true when imaging the brain, which has a natural barrier to exogenous chemicals.

A new technique known as chemical exchange saturation transfer (CEST), serves as a useful new tool for molecular MRI. The CEST imaging method offers three advantages over traditional molecular MRI techniques. First, in some cases the molecules of interest within the subject can be directly detected. This feature mitigates the need for administering contrast agents to the subject. Second, the image contrast mechanism can be controlled with the RF pulses produced by the MRI system and, as such, can be turned on and off when desired. This allows the location of specific molecules of interest to be detected by comparing images having the desired contrast present to those where it has been turned off. Lastly, the CEST imaging method is far more sensitive than traditional molecular MRI techniques, making it able to detect substantially low concentrations of given molecules.

CEST imaging renders MRI, which usually detects only bulk water signal, sensitive to metabolites and their byproducts, such as glucose and lactate. In particular, the chemical exchange between bulk water and amide protons from endogenous proteins and peptides has been shown to be sensitive to ischemic tissue acidosis, and as a result has given rise to an imaging technique referred to as amide proton transfer (APT) imaging. Since tissue pH decreases in response to abnormal glucose/oxygen metabolism during acute ischemia, pH-sensitive APT imaging may serve as a surrogate metabolic imaging marker for stroke. In that it complements perfusion and diffusion MRI, APT imaging may allow better characterization of penumbra for predicting ischemic tissue outcome in acute stroke. Moreover, APT imaging may eventually help guide thrombolytic and/or neuroprotective therapies for acute stroke.

Unfortunately, CEST and APT imaging techniques are limited to acquiring single slices of image data. This limitation is largely a factor of the very long continuous wave (CW) RF irradiation, typically a few seconds, required to reach the steady state for quantitative APT imaging. CEST and APT imaging methods typically require lipid suppression techniques, which often take tens of milliseconds. As a result, multi-slice imaging techniques suffer from decreased CEST contrast as a result of longitudinal relaxation during preparation and image acquisition. Additionally, repeating RF irradiation for each slice is a very time-consuming procedure, and thus not feasible for in vivo applications. One potential alternative is to use a concatenated short irradiation RF pulse and image readout for each k-space line, similar to methods used in conventional magnetization transfer (MT) imaging. However, the saturation frequency bandwidth for short RF irradiation pulses can be very large and, as such, they may reduce the pH-specificity of APT imaging by introducing concomitant direct RF saturation (spillover) and conventional macromolecular MT effects. Moreover, given that the endogenous in vivo APT contrast is only about 3%, multiple signal averaging is often necessary to enhance the contrast-to-noise ratio (CNR), which requires the duration for each APT scan to be minimized.

Therefore, it would be desirable to have a system and method that enables feasible multi-slice molecular imaging using MRI system.

SUMMARY OF THE INVENTION

The present invention overcomes the aforementioned drawbacks by providing a method for fast, multi-slice chemical exchange saturation transfer (CEST) imaging. More specifically, the present invention provides a method for compensating for relaxation-induced losses of the CEST contrast mechanism.

In accordance with one aspect of the invention, relaxation compensation is provided by correcting produced CEST ratio (CESTR) images for longitudinal relaxation. A $T_1$ map is produced and utilized to compensate the produced CESTR image.

In accordance with another aspect of the invention, a pulse sequence is employed that intrinsically compensates for relaxation-induced losses by recovering saturation of a labile spin species after each image slice is acquired.

The foregoing and other advantages of the invention will appear from the following description.

DETAILED DESCRIPTION OF THE PREFERRED EMBODIMENT

Figure 1:
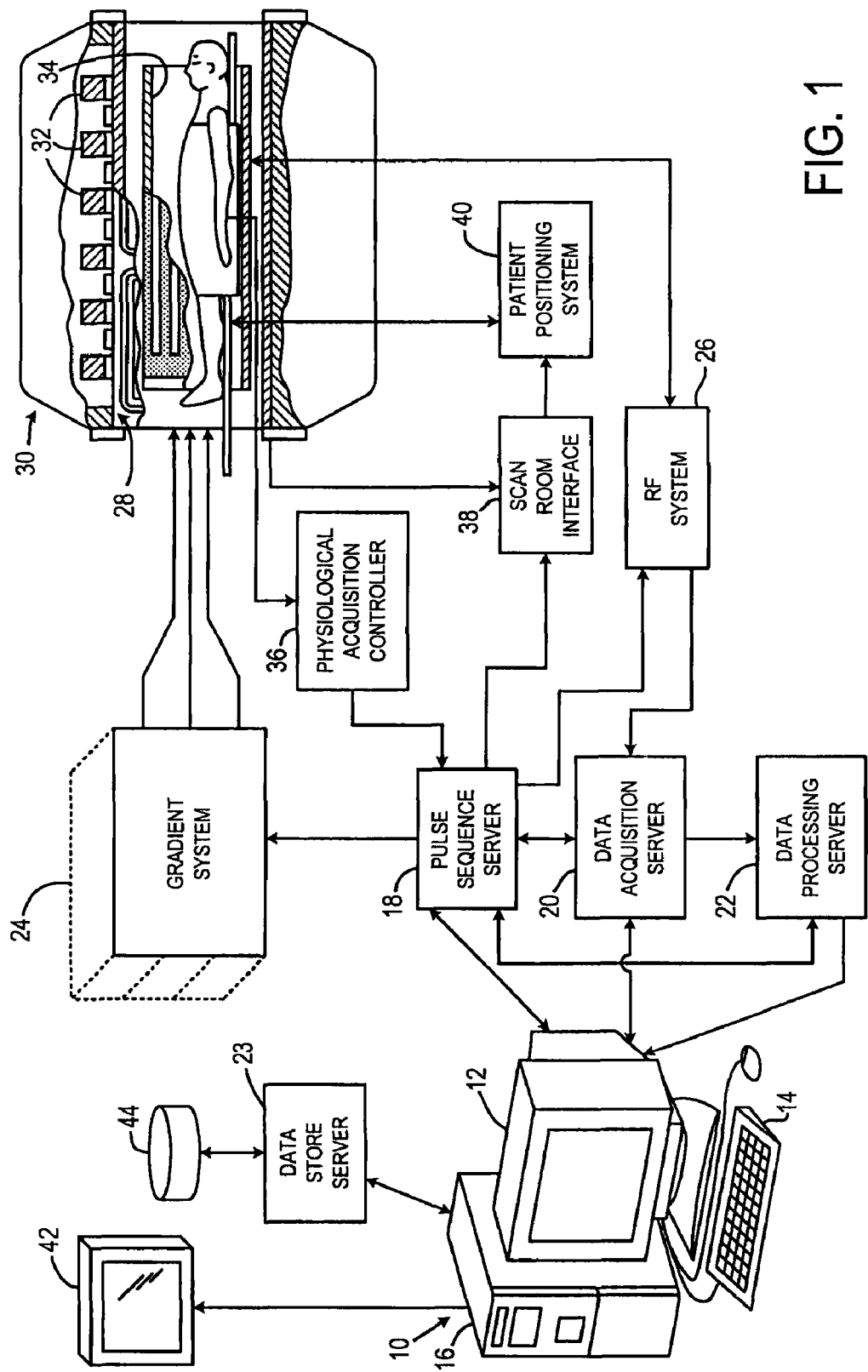
FIG. 1 is a block diagram of an MRI system which employs the present invention.

Referring particularly to FIG. 1, the preferred embodiment of the invention is employed in an MRI system. The MRI system includes a workstation 10 having a display 12 and a keyboard 14. The workstation 10 includes a processor 16 that is a commercially available programmable machine running a commercially available operating system. The workstation 10 provides the operator interface that enables scan prescriptions to be entered into the MRI system. The workstation 10 is coupled to four servers: a pulse sequence server 18; a data acquisition server 20; a data processing server 22, and a data store server 23. The workstation 10 and each server 18, 20, 22 and 23 are connected to communicate with each other.

The pulse sequence server 18 functions in response to instructions downloaded from the workstation 10 to operate a gradient system 24 and an RF system 26. Gradient waveforms necessary to perform the prescribed scan are produced and applied to the gradient system 24 that excites gradient coils in an assembly 28 to produce the magnetic field gradients $G_x$, $G_y$, and $G_z$ used for position encoding MR signals. The gradient coil assembly 28 forms part of a magnet assembly 30 that includes a polarizing magnet 32 and a whole-body RF coil 34.

Radio frequency excitation waveforms are applied to the RF coil 34 by the RF system 26 to perform the prescribed magnetic resonance pulse sequence. Responsive MR signals detected by the RF coil 34 or a separate local coil (not shown in FIG. 1) are received by the RF system 26, amplified, demodulated, filtered and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses may be applied to the whole body RF coil 34 or to one or more local coils or coil arrays (not shown in FIG. 1).

The RF system 26 also includes one or more RF receiver channels. Each RF receiver channel includes an RF amplifier that amplifies the MR signal received by the coil to which it is connected and a detector that detects and digitizes the I and Q quadrature components of the received MR signal. The magnitude of the received MR signal may thus be determined at any sampled point by the square root of the sum of the squares of the I and Q components, as given by:

$$M=\sqrt{I^2+Q^2}, \qquad \text{Eqn. 1;}$$

and the phase of the received MR signal may also be determined:

$$\phi = \tan^{-1}\left(\frac{Q}{I}\right). \qquad \text{Eqn. 2.}$$

The pulse sequence server 18 also optionally receives patient data from a physiological acquisition controller 36. The controller 36 receives signals from a number of different sensors connected to the patient, such as EGG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 that receives signals from various sensors associated with the condition of the patient and the magnet system. It is also through the scan room interface circuit 38 that a patient positioning system 40 receives commands to move the patient to desired positions during the scan.

The digitized MR signal samples produced by the RF system 26 are received by the data acquisition server 20. The data acquisition server 20 operates in response to instructions downloaded from the workstation 10 to receive the real-time MR data and provide buffer storage such that no data is lost by data overrun. In some scans the data acquisition server 20 does little more than pass the acquired MR data to the data processor server 22. However, in scans that require information derived from acquired MR data to control the further performance of the scan, the data acquisition server 20 is programmed to produce such information and convey it to the pulse sequence server 18. For example, during prescans MR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process MR signals used to detect the arrival of contrast agent in an MRA scan. In all these examples the data acquisition server 20 acquires MR data and processes it in real-time to produce information that is used to control the scan.

The data processing server 22 receives MR data from the data acquisition server 20 and processes it in accordance with instructions downloaded from the workstation 10. Such processing may include, for example: Fourier transformation of raw k-space MR data to produce two or three-dimensional images; the application of filters to a reconstructed image; the performance of a backprojection image reconstruction of acquired MR data; the calculation of functional MR images; the calculation of motion or flow images, and the like.

Images reconstructed by the data processing server 22 are conveyed back to the workstation 10 where they are stored. Real-time images are stored in a data base memory cache (not shown) from which they may be output to operator display 12 or a display that is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

As noted above, the chemical exchange saturation transfer (CEST) imaging method is built upon the method of conventional magnetization transfer. The contrast mechanism of CEST imaging allows for the detection of exchangeable proteins and peptides. This is achieved by the selective irradiation of labile protons, which in turn attenuate the bulk water signal through saturation transfer. Labile protons are saturated using either an off-resonance pulse or continuous wave of RF irradiation. This saturation process is known as "RF labeling" or simply "labeling".

Because chemical exchange is often dependent on pH, CEST imaging methods can be sensitive to microenvironment pH. A specific variant of CEST imaging methods, referred to as amide proton transfer (APT) MRI, utilizes labile amide protons from endogenous proteins and peptides to provide the CEST contrast mechanism.

The following definitions and terms are provided to better define the present invention and to guide those of ordinary skill in the art in the practice of the present invention:

$k_{ws}$ is the chemical exchange rate from bulk water to the labile proton pool;

$k_{sw}$ is the chemical exchange rate from the labile proton pool to bulk water;

$R_{1w}$ is the longitudinal relaxation rate of bulk water;

$R_{1s}$ is the longitudinal relaxation rate of the labile proton pool;

$R_{2w}$ is the transverse relaxation rate of bulk water;

$R_{2s}$ is the transverse relaxation rate of the labile proton pool;

$r_{1w}=R_{1w}+k_{ws}$ is a term that describes the effects of longitudinal relaxation and chemical exchange on bulk water;

$r_{1s}=R_{1w}+k_{sw}$ is a term that describes the effects of longitudinal relaxation and chemical exchange on the labile proton pool;

$r_{2w}=R_{2w}+k_{ws}$ is a term that describes the effects of transverse relaxation and chemical exchange on bulk water; and $r_{2s}=R_{2s}+k_{sw}$ is a term that describes the effects of transverse relaxation and chemical exchange on the labile proton pool.

CEST imaging is often described using a simple 2-pool chemical exchange model, with the magnetizations for labile protons and bulk water described by two distinct sets of Bloch equations that are coupled by chemical exchange. In this model, the bulk water Bloch equation is given by:

$$dM_{zw}/dt = -r_{1w}(M_{zw}-M_{0w}) + k_{sw}(M_{zs}-M_{0s}), \quad \text{Eqn. 3;}$$

where $M_{zw}$, $M_{zs}$, $M_{zw}$, and $M_{0s}$ are the transient and equilibrium z-magnetizations for the bulk water and labile proton pools, respectively. Likewise, the labile proton Bloch equation is given by:

$$dM_{zs}/dt = -r_{1s}(M_{zs}-M_{0s}) + k_{ws}(M_{zw}-M_{0w}), \quad \text{Eqn 4.}$$

After RF irradiation, coupling between the bulk water and labile proton groups cause their respective magnetizations to recover towards their equilibrium states in accordance with the above physical model. If the spillover effects are negligible the z-magnetization for the bulk water pool can determined by:

$$M_{zw}(t) = M_{0w}\left\{1 - \left[\frac{(r_{1s}-r_{1w})A + 2k_{sw}f\alpha}{\sqrt{B}}\sin\left(\frac{\sqrt{B}}{2}t\right) + A\cosh\left(\frac{\sqrt{B}}{2}t\right)\right]e^{-\left(\frac{r_{1w}+r_{1s}}{2}\right)t}\right\}, \quad \text{Eqn. 5;}$$

where:

$$A = \alpha \cdot \frac{k_{ws}}{r_{1w}};$$

$$B = (r_{1s}-r_{1w})^2 + 4k_{sw}k_{ws}; \text{ and}$$

$\alpha$ is a labeling coefficient, which for slow to intermediate chemical exchange has the form:

$$\alpha = \frac{\omega_1^2}{p \cdot q + \omega_1^2};$$

where:

$$p = r_{2s} - \frac{k_{sw}k_{ws}}{r_{2w}};$$

$$q = r_{1s} - \frac{k_{sw}k_{ws}}{r_{1w}};$$

and $\omega_1$ is the RF irradiation power.

Additionally, f is the proton ratio between bulk water and the labile proton and t is the duration between the end of the RF irradiation and the echo time. Generally, data from a reference scan is acquired before a label scan, in which saturation of the labile proton group occurs. For the reference scan, the irradiation pulse is applied at a reference frequency that is symmetric around the bulk water resonance frequency and opposite to the labile proton frequency. As a result, the labeling coefficient, $\alpha$, is minimal and the z-magnetization of the bulk water is given by:

$$M_{zw}(t) = M_{0w}, \quad \text{Eqn. 6.}$$

A parameter called the CEST ratio (CESTR) can be derived by taking the difference between the reference and label scans, and normalized by a control signal without RF irradiation as:

$$CESTR(t) = \frac{k_{ws}}{r_{1w}} \cdot \alpha \cdot \left[ \frac{(r_{1s}+r_{1w})}{(r_{1s}-r_{1w})} \frac{e^{\left(-r_{1w}+\frac{k_{sw}}{r_{1s}-r_{1w}}k_{ws}\right)t} - e^{-\left(r_{1s}+\frac{k_{sw}}{r_{1s}-r_{1w}}k_{ws}\right)t}}{2} + \frac{e^{\left(-r_{1w}+\frac{k_{sw}}{r_{1s}-r_{1w}}k_{ws}\right)t} + e^{-\left(r_{1s}+\frac{k_{sw}}{r_{1s}-r_{1w}}k_{ws}\right)t}}{2} \right], \quad \text{Eqn. 7.}$$

When the labile proton group is dilute, the proton ratio, f, has the form:

$$f = \frac{k_{ws}}{k_{sw}} \approx \frac{r_{1w}}{r_{1s}} \ll 1, \quad \text{Eqn. 8;}$$

and as such, CESTR can be further simplified as:

$$CESTR(t) = \frac{k_{ws}}{r_{1w}} \cdot \alpha \cdot e^{\left(-r_{1w}+\frac{k_{sw}}{r_{1s}-r_{1w}}k_{ws}\right)t}. \quad \text{Eqn. 9}$$

In addition, for dilute labile protons, $$\frac{k_{sw}}{r_{1s}-r_{1w}} \approx 1.$$

Therefore, CESTR can be even further simplified to:

$$CESTR(t) = \frac{k_{ws}}{r_{1w}} \cdot \alpha \cdot e^{-R_{1w}t}. \quad \text{Eqn. 10.}$$

Thus, the effects of longitudinal relaxation on CESTR can be compensated for and a compensated CESTR (cCESTR) determined in accordance with:

$$cCESTR \approx CESTR(t) \cdot e^{R_{1w}t} \quad \text{Eqn. 11;}$$

where t, again, is the time between the end of the RF irradiation and the echo time.

Figure 2A:
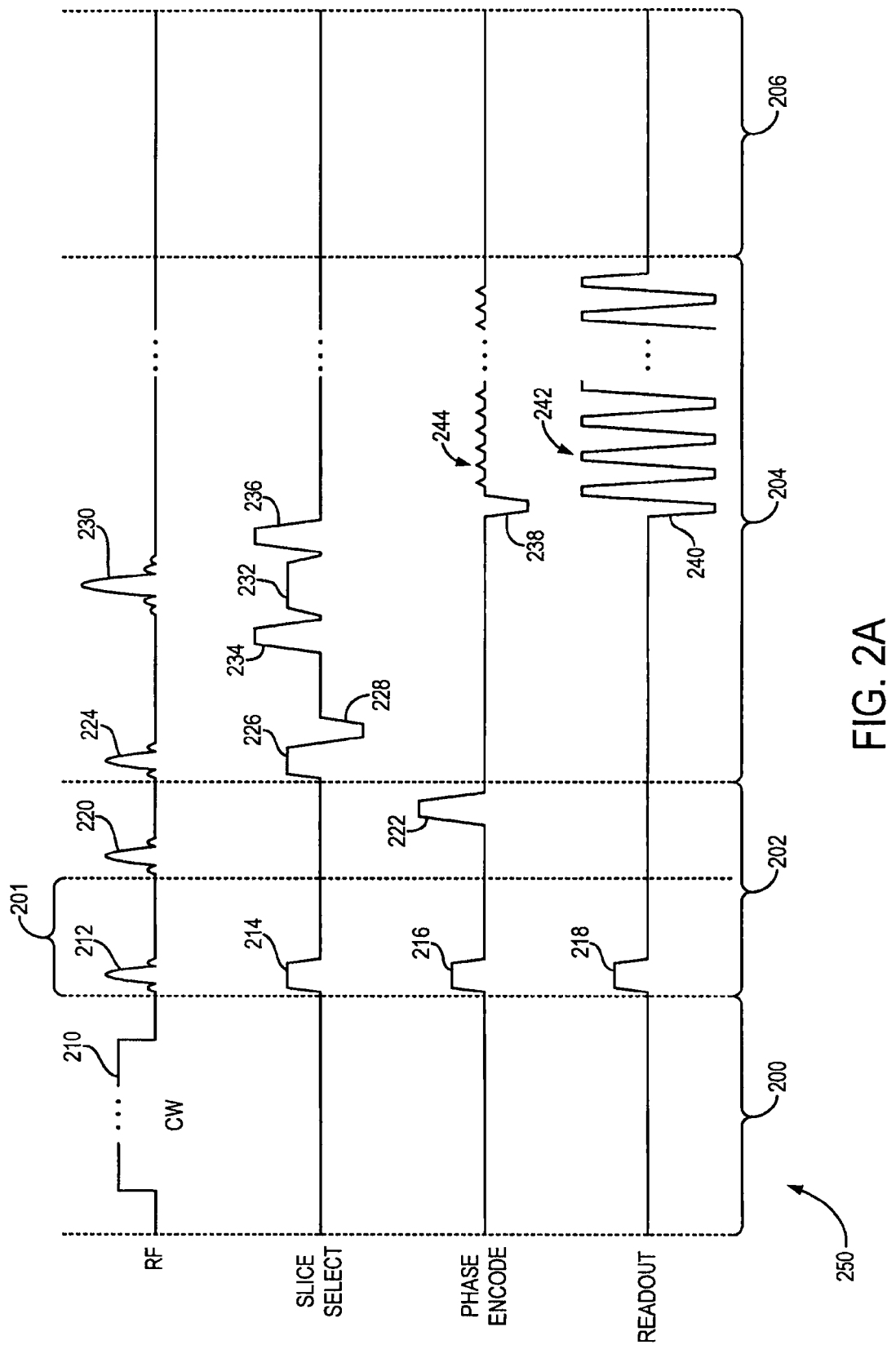
FIG. 2A is a graphic illustration of one pulse sequence for directing the MRI system of FIG. 1 to acquire imaging data in accordance with the present invention.

Referring now to FIG. 2A, a pulse sequence 250 employed to practice the present invention is shown to have five sections: a labeling section 200, wherein RF labeling occurs; a preparation section 202, which includes an outer volume suppression module 201 and fat suppression; a data acquisition section 206; and an idle period 208. The labeling section 200 of the pulse sequence 250 includes the application of continuous wave (CW) RF irradiation at a selected off-resonance frequency to "label" the labile proton pool spins. However, a series repetitive frequency-selective RF irradiation pulses can alternatively be applied to the subject in order to achieve the desired labeling. In one contemplated process, the labile proton group includes amide protons on proteins and peptides; however, the present invention can be practiced in any application that utilizes CEST imaging methods and the labile proton group can include many variations appreciated by those skilled in the art.

The imaging volume is next prepared during the preparation section 202 of the pulse sequence 250. First, outer volume suppression is performed through the application of the outer volume suppression module 201. An RF excitation pulse 212 is applied in the presence of magnetic field gradients that are applied in three orthogonal directions: one along the z-axis 214, one along the y-axis 216, and one along the x-axis 218. As a result, a region in the peripheral outer volume of the subject is selectively excited such that the MR signals originating from the region can be selectively suppressed. The outer volume suppression module 201 is repeated a plurality of times until a desired region of the subject has been selectively excited. Next, the pulse sequence 250 proceeds with a fat suppression section. In one embodiment, fat suppression is achieved with a chemical shift selective CHESS method; however, it is contemplated that any fat suppression technique can be employed. For the CHESS method, a spectrally selective excitation pulse 220 is applied to excite all of the spins corresponding to fat tissue in the imaging volume selectively excited during the outer volume suppression module 201. In order to maintain a substantially homogeneous $B_0$ field for effective CHESS fat suppression, higher-order shimming gradients are utilized prior to execution of the pulse sequence 250. A spoiler gradient 222 is then applied to reduce the signal from the excited fat spins. As a result, substantially no fat molecules will produce a detectable NMR signal during subsequent imaging. Alternatively, it is contemplated that the spoiler gradient 222 may be replaced with a crusher gradient.

The data acquisition section 204 of the pulse sequence 250 is then performed. In one embodiment, data acquisition occurs by employing a spin-echo, echo planar imaging (EPI) sequence. First, a slice selective gradient 226 is played out during the application of an RF excitation pulse 224. To mitigate signal loss resultant from phase dispersions introduced by the slice selective gradient 226, a rephasing lobe 228 is applied after the slice selective gradient 226. A rephasing RF pulse 230 is then applied in the presence of another slice selective gradient 232. In order to substantially reduce unwanted phase dispersions, a first crusher gradient 234 bridges the slice selective gradient 232 with a second crusher gradient 236. A pre-phaser gradient waveform 238 is then applied in the phase encoding direction, and a pre-phaser pulse 240 in the readout direction followed by an alternating readout gradient pulse train 242 is then applied. A spin-echo MR signal is acquired during each positive and negative top of the readout pulse train 242 and a phase-encoding gradient "blip" 244 is applied between each readout to separately phase encode each acquired echo signal, or view. The data acquisition section 204 is repeated a plurality of times with a different first slice selective gradient 226 and second slice selective gradient 232 such that multiple slices of image data are acquired. Each repetition of the pulse sequence 250 ends with an idle period 206.

Figure 3:
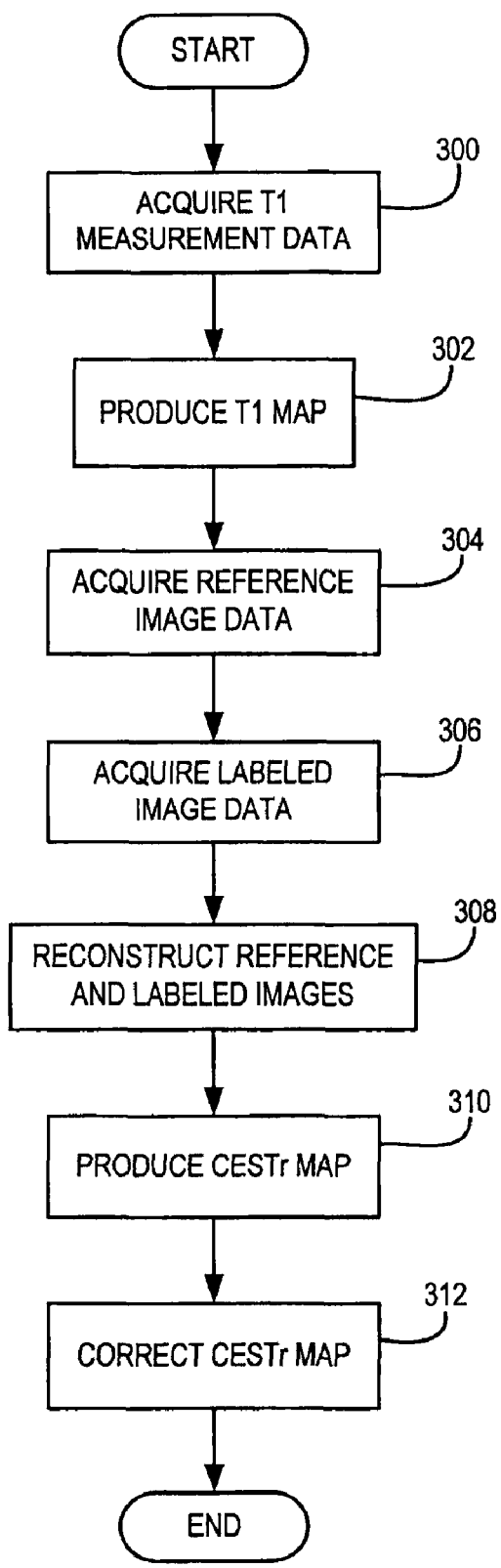
FIG. 3 is a flowchart setting forth the steps of a method for correcting chemical exchange saturation transfer image data in accordance with the present invention.

Referring particularly to FIG. 3, the pulse sequence 250 described above is employed to acquire MR image data that is sensitive to the CEST contrast mechanism. Furthermore, from the image data a CEST ratio map is produced and subsequently corrected for relaxation-induced losses of CEST contrast. First, $T_1$ measurement data is acquired in step 300. In one embodiment, a Look-Locker EPI pulse sequence is employed to rapidly acquire $T_1$ measurements as the transverse magnetization recovers to equilibrium. From the acquired $T_1$ measurements, a $T_1$ map is produced, as indicated by step 302. Next, reference image data is acquired from the subject by performing the imaging pulse sequence 250 described above in reference to FIG. 2A, as indicated at step 304. In order to acquire reference image data, the imaging pulse sequence 250 is performed by applying the continuous wave RF irradiation 210 at a reference frequency, $-\Delta f_s$. Labeled image data is then acquired at step 306 through the performance of the imaging pulse sequence 250, wherein now the continuous wave RF 210 is applied at a labeling frequency, $\Delta f_s$. It should be noted that the reference frequency, $-\Delta f_s$, and the labeling frequency, $\Delta f_s$, are chosen to be symmetric about the bulk water resonance frequency. Moreover, the labeling frequency is preferably chosen as the chemical shift difference between bulk water and the labile protons. Next, reference and labeled images are reconstructed in step 308 through conventional Fourier transform methods.

From the reconstructed reference and labeled images, a CEST ratio (CESTR) map is produced by subtracting the labeled images from the corresponding reference images, as indicated at step 310. At step 312, a compensated CESTR (cCESTR) map is produced from the CESTR map and using the $T_1$ map by correcting for longitudinal magnetization relaxation effects on a voxel-by-voxel basis and is carried out in accordance with equation 11 described above, such that:

$$cCESTR(i, j) = CESTR(i, j) \cdot e^{\frac{t}{T_{1w}(i,j)}}, \quad \text{Eqn. 12}$$

where cCESTr(i,j) indicates a voxel value in the compensated CESTR map at voxel location (i,j), CESTr(i,j) indicates the voxel value in the CESTR map at the corresponding voxel location (i,j), and $T_{1w}(i,j)$ indicates the voxel value in the produced $T_1$ map at the corresponding voxel location (i,j). Additionally, t is the duration of time after the RF irradiation at which the signal corresponding to a given image was acquired.

Alternatively, a control scan can be performed by performing the imaging pulse sequence 250 without the labeling section 200. A control image is then reconstructed from the acquired control scan data and employed to normalize the produced CESTR image by dividing the CESTR image by the reconstructed control image.

Figure 2B:
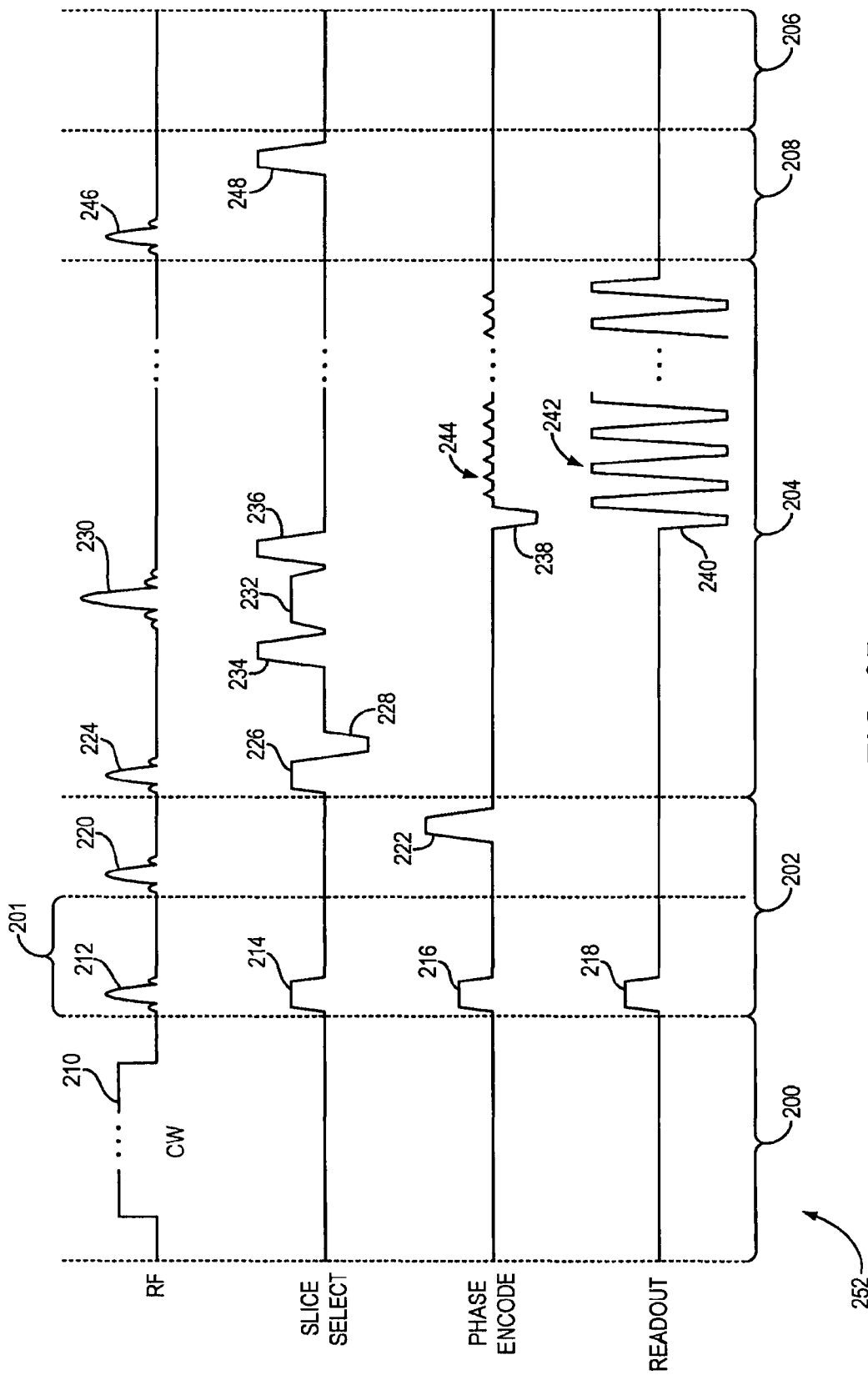
FIG. 2B is a graphic illustration of another pulse sequence for directing the MRI system of FIG. 1 to acquire imaging data in accordance with the present invention.

Referring now to FIG. 2B, it is contemplated that another pulse sequence 252 may be utilized to compensating for relaxation-induced losses of the CEST contrast mechanism. This pulse sequence 252 is similar to the one described above except that a second labeling section 208 is appended after the data acquisition section 204. As such, performance of the pulse sequence 252 proceeds much like in the sequence 250 described above with respect to FIG. 2A. A labeling section 200 acts to saturate the labile proton group, by applying a continuous wave (CW) RF irradiation at a selected off-resonance frequency. The preparation section 202 is then played out. First, an outer volume suppression module 201 repeatedly selectively excites the outer volume regions of the subject being imaged by applying an RF excitation pulse 212 in the presence of an x-gradient 218, y-gradient 216, and z-gradient 214. Lipid suppression follows through the application of a spectrally selective excitation pulse 220 and a spoiler gradient 222 that substantially reduces lipid signal from the previously selected spins. Differing from the previously described pulse sequence 250, the presently described embodiment only plays out the data acquisition section 204 for one imaging slice at a time. At the end of the data acquisition section 204, a second labeling section 208 applies an additional saturation pulse 246 at the selected off-resonance frequency that acts to recover saturation of the labile proton group that was lost to longitudinal relaxation. A spoiler gradient 248 is then applied to dephase any residual transverse magnetization. The pulse sequence 252 then repeats the preparation 202, data acquisition 204, and second labeling 208 sections, during each repetition altering the first 226 and second 232 slice selective gradients in the data acquisition section 204. In this manner, the pulse sequence 252 can be employed to rapidly acquire multiple slices of CEST image data that are intrinsically compensated for longitudinal relaxation induced losses of CEST contrast.

Figure 4:
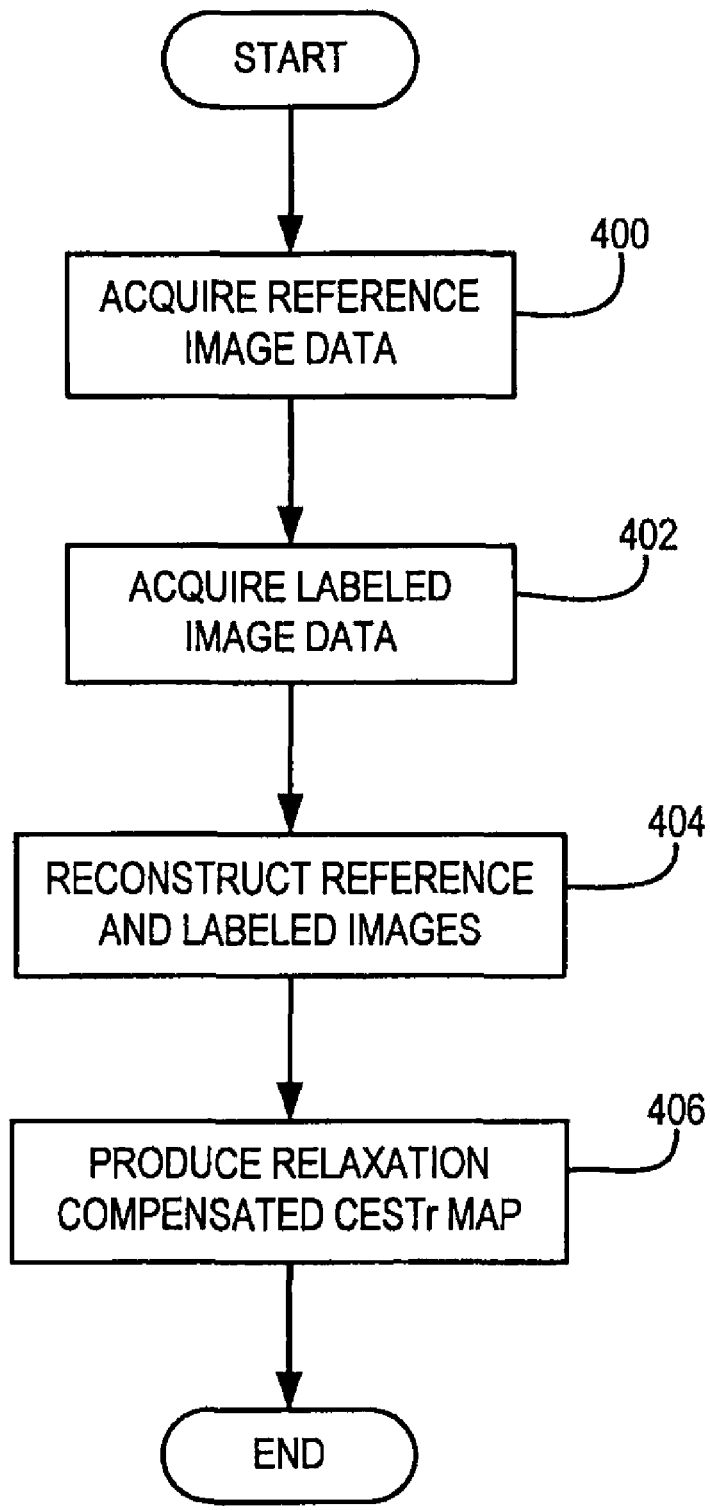
FIG. 4 is another flowchart depicting the steps of another method for correcting chemical exchange saturation transfer image data in accordance with the present invention.

Referring now particularly to FIG. 4, a method for practicing the present invention, which employs the pulse sequence 252 shown in FIG. 2B, is presented. Because the pulse sequence 252 intrinsically compensates for the relaxation-induced loss of CEST contrast, no explicit $T_1$ measurement is performed. Instead, reference image data is acquired in step 400 by performing the imaging pulse sequence 252 with the application of the continuous wave RF irradiation 210 at a reference frequency, $-\Delta f_s$. Furthermore, the additional saturation pulse 246 is also applied at the reference frequency, $-\Delta f_s$. Labeled image data is then acquired at step 402 through the performance of the imaging pulse sequence 252, wherein now the continuous wave RF 210 and additional saturation pulse 246 are applied at a labeling frequency, $\Delta f_s$. From these two sets of data, reference and labeled images are reconstructed in step 404. A CESTR image is then produced in step 406 in a manner similar to that described above in step 310. However, since the data acquired with the pulse sequence 252 intrinsically compensates for relaxation-induced losses of the CEST contrast mechanism, no additional compensation is performed. Alternatively, a control scan can be performed by performing the imaging pulse sequence 252 without the first 200 and second 208 labeling sections. A control image is then reconstructed from the acquired control scan data and employed to normalize the produced CESTR image by dividing the CESTR image by the reconstructed control image.

The present invention has been described in terms of one or more embodiments, and it should be appreciated that many equivalents, alternatives, variations, and modifications, aside from those expressly stated, are possible and within the scope of the invention. For example, the present invention may be practiced with a gradient-recalled echo EPI pulse sequence and the selected slice may be oriented in any direction by proper rotation of the phase-encoding, readout and slice selection gradient fields. Additionally, other variants of the CEST ratio can be produced, such as by dividing the reconstructed labeled images by the corresponding reference images.

The invention claimed is:

1. A method for producing an image of a subject with a magnetic resonance imaging (MRI) system the steps comprising:
    a) acquiring, with the MRI system reference image data using a first pulse sequence that saturates a selected labile spin species by applying a radiofrequency (RF) irradiation at a reference frequency,
    b) acquiring, with the MRI system, labeled image data using a second pulse sequence that saturates a selected labile spin species by applying an RF irradiation at a labeling frequency;
    c) reconstructing a reference image from the acquired reference image data and a labeled image from the acquired labeled image data; and
    d) producing a corrected ratio image by subtracting the reconstructed labeled image form the reference image to correct for relaxation-induced losses by recovering saturation of the selected labile spin species.

2. The method of claim 1 wherein the applied RF irradiation is a continuous wave RF irradiation.

3. The method of claim 1 wherein the applied RF irradiation is a series of RF pulses.

4. The method of claim 1 further comprising:
    e) acquiring, with the MRI system, signal data indicative of a relaxation parameter; and
    wherein step d) includes producing, from the acquired signal data, a relaxation parameter image and producing a first ratio image from the reconstructed reference and labeled images.

5. The method of claim 4 wherein the corrected ratio image is produced by multiplying voxel values in the first ratio image by corresponding voxel values in the relaxation parameter image.

6. The method of claim 4 wherein the relaxation parameter is a longitudinal relaxation rate.

7. The method of claim 1 wherein the selected labile spin species includes amide protons.

8. The method of claim 1 wherein at least one of the first and second pulse sequence is configured to intrinsically compensate for relaxation-induced losses by recovering saturation of a labile spin species after each image slice is acquired.

9. The method of claim 1 wherein the first pulse sequence includes a continuous wave RF irradiation at the reference frequency, wherein the reference frequency is $-\Delta f_s$, and a saturation pulse at the reference frequency, $-\Delta f_s$.

10. The method of claim 9 wherein the second pulse sequence includes a continuous wave RF and a saturation pulse applied at the labeling frequency, wherein the labeling frequency is $\Delta f_s$.

11. A method for producing an image of a subject with a magnetic resonance imaging (MRI) system, the method comprising the steps of:
    a) acquiring, with the MRI system, T1 measurement data;
    b) producing a T1 map from the acquired T1 measurement data;
    c) acquiring, with the MRI system, reference image data and labeled image data from the subject;
    d) reconstructing a reference image from the reference image data and a labeled image from the labeled image data;
    e) producing a CEST Ratio (CESTR) map by subtracting the labeled image from reference image; and
    f) producing a compensated CESTR (cCESTR) map using the CESTR map and T1 map by correcting for longitudinal magnetization relaxation effects on a voxel-by-voxel basis.

12. The method of claim 11 wherein step a) includes performing a Look-Locker EPI pulse sequence with the MRI system to acquire the $T_1$ measurement data as transverse magnetization recovers to equilibrium.

13. The method of claim 11 wherein step c) includes performing an imaging pulse sequence including:
    a labeling section, wherein RF labeling is performed;
    a preparation section, which includes an outer volume suppression module and fat suppression;
    a data acquisition section; and
    an idle period.

14. The method of claim 13 wherein the imaging pulse sequence is performed a first time to acquire the reference image data and the imaging pulse sequence is performed a second time to acquire labeled image data.

15. The method of claim 14 wherein the imaging pulse sequence includes apply a continuous wave RF at a labeling frequency, $\Delta f_s$ and a reference frequency, $-\Delta f_s$.

16. The method of claim 15 wherein the labeling frequency, $\Delta f_s$ and reference frequency, $-\Delta f_s$ are selected to be symmetric about a bulk water resonance frequency.

17. The method of claim 15 wherein the labeling frequency is selected as a chemical shift difference between bulk water and the labile protons.

18. The method of claim 11 wherein step f) wherein the cCESTR map is calculated according to:

$$cCESTR(i, j) = CESTR(i, j) \cdot e^{\frac{t}{T_{1w}(i,j)}},$$

where cCESTr(i,j) indicates a voxel value in the cCESTR map at voxel location (i,j), CESTr(i,j) indicates a voxel value in the CESTR map at a corresponding voxel location (i,j), $T_{1w}(i,j)$ indicates a voxel value in the $T_1$ map at the corresponding voxel location (i,j), and t is the duration of time after RF irradiation at which a signal corresponding to a given image was acquired.

19. A method for producing an image of a subject with a magnetic resonance imaging (MRI) system, the method comprising the steps of:
    a) acquiring, with the MRI system, T1 measurement data;
    b) producing a T1 map from the acquired T1 measurement data;
    c) acquiring, with the MRI system, reference image data and control image data from the subject;
    d) reconstructing a reference image from the reference image data and a control image from the control image data;
    e) producing a Chemical Exchange Saturation Transfer Ratio (CESTR) map using the reference image and the control image; and
    f) producing a compensated CESTR (cCESTR) map using the CESTR map and T1 map by correcting for longitudinal magnetization relaxation effects on a voxel-by-voxel basis.

20. The method of claim 19 wherein step e) includes normalizing the CESTR map by dividing the CESTR map by the control image.

* * * * *